United States Patent [19]

Naarmann et al.

[11] Patent Number: 4,560,593
[45] Date of Patent: Dec. 24, 1985

[54] DEPOSITION OF METALS ON ELECTRICALLY CONDUCTIVE, POLYMERIC CARRIERS

[75] Inventors: Herbert Naarmann, Wattenheim; Volker Münch, Ludwigshafen; Klaus Penzien, Frankenthal, all of Fed. Rep. of Germany

[73] Assignee: BASF Aktiengesellschaft, Fed. Rep. of Germany

[21] Appl. No.: 662,546

[22] Filed: Oct. 19, 1984

Related U.S. Application Data

[63] Continuation of Ser. No. 401,348, Jul. 23, 1982, abandoned.

[30] Foreign Application Priority Data

Aug. 14, 1981 [DE] Fed. Rep. of Germany ....... 3132218

[51] Int. Cl.$^4$ .............................................. C23C 3/02
[52] U.S. Cl. ................................ 427/443.1; 204/58.5; 204/38.7; 427/98
[58] Field of Search .............................. 427/443.1, 98

[56] References Cited

U.S. PATENT DOCUMENTS

| | | | |
|---|---|---|---|
| 4,204,216 | 5/1980 | Heeger | 252/512 |
| 4,340,507 | 7/1982 | Naarmann | 252/512 |
| 4,394,304 | 7/1983 | Wnek | 252/512 |
| 4,395,497 | 7/1983 | Naarmann | 252/512 |
| 4,412,942 | 12/1983 | Naarmann | 252/512 |

OTHER PUBLICATIONS

A. McDiarmid & A. G. Heeger, "Synthetic Metals", vol. 1, (1980), pp. 101–118.
R. H. Baugham et al, "Journal of Chemical Physics", vol. 73, No. 8, (1980), pp. 4098–4102.
F. E. Karasz et al, "Nature", vol. 282, No. 5736, (1979), pp. 286–288.

*Primary Examiner*—John D. Smith
*Attorney, Agent, or Firm*—Keil & Weinkauf

[57] ABSTRACT

A process for depositing metals onto electrically conductive, polymeric carriers, wherein a finely divided metal M having a standard potential $E_o$ of $> -2$ V is deposited, from a solution of a metal cation compound of the formula (I)

$$M'_l L_m^1 L_n^2 L_o^3 L_p^4 \quad (I)$$

where
M', $L^1$, $L^2$, $L^3$, $L^4$, l, m, n, o, and p are as defined in the claims, in an aprotic polar or non-polar solvent, onto a polymeric, electrically conductive carrier of the formula (II)

$$[M_y''(P)]_x \quad (II)$$

where
M'' is Li, Na, K, Rb or Cs,
P is P=—CH—, —C$_6$H$_4$—, —C$_4$H$_2$S—, —C$_6$H$_4$S—, —C$_4$H$_2$O—, —C$_4$H$_2$NH— —C$_6$H$_4$O— or —C$_5$H$_3$N—
y is from 0.001 to 0.6 and
x is from 5 to 1,000, or onto a polymeric, electrically conductive carrier of the formula (III)

$$[(P)(X)_y]_x \quad (III)$$

where
P is one of the groups listed for formula (II), X is ClO$_4$$^\ominus$, AsF$_6$$^\ominus$, PF$_6$$^\ominus$, SbF$_6$$^\ominus$, BF$_4$$^\ominus$, HSO$_4$$^\ominus$, CF$_3$SO$_3$$^\ominus$ or Br$^\ominus$,
y is from 0.001 to 0.6 and
x is from 5 to 1,000, by reduction, preferably at from $-100°$ to $+100°$ C. The electrically conductive, polymeric systems can be employed in the electrical industry for the production of solar cells, for converting and fixing radiation, and for the production of electric and magnetic switches and electrical storage devices, and can also be used as heterogeneous catalysts and to provide an antistatic finish on plastics.

5 Claims, No Drawings

DEPOSITION OF METALS ON ELECTRICALLY CONDUCTIVE, POLYMERIC CARRIERS

This is a continuation of application Ser. No. 401,348, filed on July 23, 1982, now abandoned.

The present invention relates to a process for the deposition of metals onto electrically conductive, polymeric carriers.

In the process according to the invention, a doped electrically conductive polymer, in particular a polyacetylene, is made the electrode and a very finely divided metal is deposited onto this organic electrode, or the polymer is employed in the form of crystallization seeds, or the metal is deposited directly from the liquid, gas or vapor phase by thermal decomposition or charge neutralization.

It has been disclosed that a polymer, such as a polyacetylene (cf. A. McDiarmid and A. G. Heeger, Synthetic Metals, 1, (1980), 101–118) or a poly(p-phenylene) (cf. R. H. Baughman et al., J. Chem. Phys., 73, 8 (1980), 4098–4102) can be reacted with a metal, such as Li, Na, K, Rb or Cs, to give an electrically conductive polymer. Because they are light, these materials have advantages over pure metals, but they have the disadvantage of being very sensitive towards oxygen (cf. J. M. Pochan et al., J. Polym. Sci., Polym. Lett. Ed., 18 (1980), 447–451). From the morphologies of such potentially conductive polymers, in particular the fibrid morphology of polyacetylenes (cf. F. E. Karasz et al., Nature, 282, 5736 (1979), 286–288), they appear to be suitable carriers for metals.

It is also known that metals having a negative standard potential $E_o$ (V), e.g. Li($E_o = -3.045$ V), Na($E_o = -2.71$ V), K($E_o = -2.924$ V), Rb($E_o = -2.925$ V) or Cs($E_o = -2.923$ V) (cf. Handbook of Chemistry and Physics, 1975-1976 edition, CRC Press, D 141 to D 146), can reduce metal cations having a less negative standard potential to the metals. The arrangement of the metals in order of increasing standard potential is referred to as the electrochemical potential series, as defined, for example, in K.-H. Naser, Physikalische Chemie, VEB-Verlag, Leipzig, 1971, pages 329 to 355. See also this reference for the definition of the term standard potential $E_o$.

It is moreover known that reduction of a metal cation to a metal can also be effected electrochemically if a metal electrode is immersed in a solution of the metal cation of the same element (or of another) in an electrolytic cell, as described in, for example, R. Brdicka Grundlagen der Physikalischen Chemie, VEB Verlag, Leipzig (1968), pages 668 to 671, and is made the cathode. After the voltage corresponding to the standard potential or the deposition voltage (cf. K. Schäfer, Physikalische Chemie, 2nd edition, Springer Verlag, Berlin, page 249) has been reached, reduction of the metal cation starts and the metal is deposited on the cathode, as is described, for example, for the industrial electrolysis of copper (cf. Hollemann/Wiberg, Lehrbuch der anorganischen Chemie, 71st to 80th edition, de Gruyter (1971), pages 708 to 711).

It is furthermore known that metals can be applied by fusion (cf. G. Brauer, Handbuch der Praparativen Anorganischen Chemie, Volume 2, F. Enke Verlag, Stuttgart, pages 946 to 947), by reduction (Hollemann/Wiberg, Lehrbuch der anorganischen Chemie, 71st to 80th edition, pages 723–724 or N. V. Roman and N. V. Demidenko in Russ. Chem. Rev., 44 (1975), 2150–2170) or by impregnation of an inert solid, e.g. $Al_2O_3$, $SiO_2$, active charcoal, $TiO_2$, zeolites, MgO or silicon carbide, with a metal salt solution and subsequent reduction, as described by, for example, R. Krabetz and W. D. Mross in Ullmanns Encyklopädie der technischen Chemie, 4th edition, Volume 13, Verlag Chemie, Weinheim (1977), pages 517–569. Such finely divided metals have high catalytic activities, but they also have the disadvantage that the carrier is not electrically conductive and is frequently heavy.

It is also known that metals can be applied to carriers by thermal decomposition of metal carbonyls such as $Fe_2(CO)_9$ (cf. D. Nicholls in Comprehensive Inorganic Chemistry, Volume 3, pages 995-996, Pergamon Press, Oxford, 1973).

It is furthermore known that very finely divided metals, e.g. Raney nickel (cf. Organikum, 1st edition, VEB-Verlag, Leipzig (1970), pages 814–820) have a powerful catalytic action, but cannot be used in any form as materials.

It is an object of the present invention to provide systems where a very finely divided metal is applied to a light, electrically conductive, polymeric carrier, with no drop in the electrical conductivity of the system, an increase in the stability of oxygen, no reduction in catalytic activity and a great saving in weight in comparison with conventional metal/carrier systems. Moreover, such systems should have the advantageous properties of polymeric, organic systems, e.g. flexibility, moldability, extensibility, good processability and the like.

We have found that this object is achieved by a process in which a finely divided metal M having a standard potential $E_o$ of $> -2$ V is desposited, from a solution of a metal cation compound of the general formula (I)

$$M'L_m^1 L_n^2 L_o^3 L_p^4 \qquad (I)$$

where M' is $Au^\oplus$, $Au^{3\oplus}$, $Pt^{2\oplus}$, $Hg^{2\oplus}$, $Os^{4\oplus}$, $Pd^{2\oplus}$, $Ag^\oplus$, $Hg_2^{2\oplus}$, $Ir^{3\oplus}$, $Te^{4\oplus}$, $Se^{4\oplus}$, $Cu^\oplus$, $Cu^{2\oplus}$, $Rh^{3\oplus}$, $Re^{3\oplus}$, $As^{3\oplus}$, $Sb^{3\oplus}$, $Bi^{3\oplus}$, $Sn^{4\oplus}$, $Mo^{6\oplus}$, $W^{6\oplus}$, $Fe^{3\oplus}$, $Sn^{2\oplus}$, $Pb^{2\oplus}$, $Ge^{4\oplus}$, $Ni^{2\oplus}$, $Co^{2\oplus}$, $Tl^\oplus$, $Cd_2^\oplus$, $Fe^{2\oplus}$, $Cr^{2\oplus}$, $Ga^{3\oplus}$, $Cr^{3\oplus}$, $Ta^{5\oplus}$, $Zn^{2\oplus}$, $In^{3\oplus}$, $Y^{3\oplus}$, $Ru^{5\oplus}$, $Mn^{2\oplus}$, $Si^{4\oplus}$, $V^{2\oplus}$, $Zr^{4\oplus}$, $Hf^{4\oplus}$, $Ce^{3\oplus}$, $Al^{3\oplus}$, $Be^{2\oplus}$, $Ti^{2\oplus}$, $Ti^{2\oplus}$, $U^{3\oplus}$, $Th^{4\oplus}$ or $Np^{3\oplus}$ and $L^1$, $L^2$, $L^3$ and $L^4$ are identical or different and each is $F^\ominus$, $Cl^\ominus$, $Br^\ominus$, $I^\ominus$, $CN^\ominus$, CO, $NO_3^\ominus$, RCN (where R is $C_1$–$C_6$-alkyl, cycloalkyl or aryl), $NR^1R^2R^3$ (where $R^1$, $R^2$ and $R^3$ are identical or different and each is H, $C_1$–$C_{10}$-alkyl, cycloalkyl or aryl), $R_1R_2N$—$(CH_2)_n$—$NR^1R^2$ (where $R^1$ and $R^2$ are identical or different and each is $C_1$–$C_6$-alkyl or cycloalkyl and n is from 1 to 6), $PR^1R^2R^3$ (where $R^1$, $R^2$ and $R^3$ are identical or different and each is H, $C_1$–$C_6$-alkyl, cycloalkyl, aryl, $C_1$–$C_6$-alkoxy, cycloalkoxy or aryloxy), $OPR^1R^2R^3$ (where $R^1$, $R^2$ and $R^3$ are identical or different and each is $C_1$–$C_6$-alkyl, cycloalkyl, aryl, $C_1$–$C_6$-alkoxy, cycloalkoxy or aryloxy), pyridyl, $CH_3COO^\ominus$, $CH_3SO_3^\ominus$, $H_3PO_2^\ominus$, dimethylsulfoxide, acetylacetone, ether, hexamethylphosphoramide, N-methylpyrrolidone, sulfolane, propanediol 1,2-carbonate, acetone, ethyl acetate, dimethylformamide or N,N-dimethylacetamide and l, m, n, o and p added together are from 1 to 6, in an aprotic polar or non-polar solvent, onto a polymeric, electrically conductive carrier of the general formula (II)

$$[M_{y}''(P)]_x \quad (II)$$

where

M'' is Li, Na, K, Rb or Cs,

P is P=$+$CH$+$, $+$C$_6$H$_4+$, $+$C$_4$H$_2$S$+$, $+$(C$_6$H$_4$S$+$, $+$C$_4$H$_2$O$+$, $+$C$_4$H$_2$NH$+$, $+$C$_6$H$_4$O$+$ or C$_5$H$_3$N$+$ y is from 0.001 to 0.6 and x is from 5 to 1,000, or onto a polymeric, electrically conductive carrier of the general formula (III)

$$[(P)(X)_y]_x \quad (III)$$

where

P is one of the groups listed for formula (II),

X is ClO$_4^\ominus$, AsF$_6^\ominus$, PF$_6^\ominus$, SbF$_6^\ominus$, BF$_4^\ominus$, HSO$_4^\ominus$, CF$_3$SO$_3^\ominus$ or Br$^\ominus$, y is from 0.001 to 0.6 and x is from 5 to 1,000, by reduction.

In a preferred procedure, deposition of the metal M' onto an electrically conductive, polymeric carrier of the general formula (II), where y is from 0.1 to 0.6 and x is from 5 to 1,000, is carried out chemically, in the presence or absence of an auxiliary reducing agent, e.g. hydrazine, SnCl$_2$ or H$_3$PO$_2$.

A process in which deposition of the metal M onto an electrically conductive, polymeric carrier of the general formula (II) or (III), where y is from 0.001 to 0.1 and x is from 5 to 1,000, is carried out electrochemically, with the carrier made the cathode in an electrolytic cell or applied to a cathode, is also preferred.

Preferred aprotic polar solvents are acetonitrile, sulfolane, propanediol 1,2-carbonate, acetone, acetylacetone, ethyl acetate, diethyl ether, trimethyl phosphate, tributyl phosphate, dimethylformamide, N,N-dimethylacetamide, N-methylpyrrolidone, dimethylsulfoxide and hexamethylphosphoramide, and preferred aprotic non-polar solvents are n-hexane, n-heptane, n-octane, ligroin, benzene, toluene and xylene.

A process in which the deposition of the metal M onto the electrically conductive, polymeric carrier of the general formula (II) is carried out at from −100° to +100° C. is also suitable.

EXAMPLES 1-10

A p-doped polyacetylene film doped with ClO$_4^\ominus$, produced as described in European Patent Application No. 236,118, published Sept. 23, 1981, Example 2, was made the cathode. The counter-electrode was a Pt anode. Propylene carbonate containing 0.1 M of metal salts was used as the electrolyte. The voltaage was 3 volts and the current was 500 mA. The cations were deposited on the cathode, the electrolyte and the dissolved metal salts being varied.

Table 1 below shows the variations in the metals used and the amounts (in percent by weight, based on the p-(CH)$_x$ electrode) of the individual metals deposited on the cathode.

A fresh p-(CH)$_x$ electrode and a fresh electrolyte were used for each experiment.

Unless indicated otherwise, the reaction time was one hour in each case.

TABLE 1

| Example No. | Metal salt | | Amount deposited, in % by weight |
|---|---|---|---|
| 1 | Pb(NO$_3$)$_2$ | | 160 |
| 2 | Cu(NO$_3$)$_2$ | | 154 |
| 3 | Bi(NO$_3$)$_3$ | | 202 |
| 4 | AgNO$_3$ | | 180 |
| 5 | TlNO$_3$ | | 175 |
| 6 | Pb(NO$_3$)$_2$ | 2 hours | 290 |
| 7 | Pb(NO$_3$)$_2$ | 3 hours | 320 |
| 8 | Pb(NO$_3$)$_2$ | 4 hours | 450 |
| 9 | Zn(NO$_3$)$_2$ | | 150 |
| 10 | Mn(NO$_3$)$_2$ | | 180 |

EXAMPLES 11-20

An n-doped polyacetylene film doped with lithium, produced as described in Synthetic Metals, 1, (1980), 101–118, was made the cathode. The counter-electrode was a platinum anode. Propylene carbonate containing 0.1 M of metal salts was used as the electrolyte. The voltage was 3 volts and the current was 500 mA. The cations were deposited on the cathode, the electrolyte and the dissolved metal salts being varied.

Table 2 below shows the variations in the metals used and in the amounts (in percent by weight, based on the n-(CH)$_x$ electrode) of the individual metals deposited on the cathode.

A fresh n-(CH)$_x$ electrode and a fresh electrolyte were used for each experiment.

Unless indicated otherwise, the reaction time was one hour in each case.

TABLE 2

| Example No. | Metal salt | | Amount deposited, in % by weight |
|---|---|---|---|
| 11 | FeBr$_3$ anhydrous | 2 hours | 120 |
| 12 | [Ni(NH$_3$)$_6$]$^{2\oplus}$(Br$^\ominus$)$_2$ | | 147 |
| 13 | [Re(CO)$_5$]$^\oplus$(AlCl$_4$)$^\ominus$ | | 206 |
| 14 | [Cu(Pyridine)$_4$]$^\oplus$Cl$^\ominus$ | | |
| 15 | Mn$^{2\oplus}$(CH$_3$COO$^\ominus$)$_2$ anhydrous | | 200 |
| 16 | [Mn(CO)$_4$(NH$_3$)$_2$]$^\oplus$Br$^\ominus$ | | 195 |
| 17 | [Co(HMPT)$_4$]$^{2\oplus}$(ClO$_4$)$^\ominus$)$_2$ | 3 hours | 410 |
| 18 | [Ni(HMPT)$_4$]$^{2\oplus}$(ClO$^\ominus_4$)$_2$ | | 390 |
| 19 | Zn$^{2\oplus}$(H$_3$PO$_2^\ominus$)$_2$ | | 150 |
| 20 | Pb$^{2\oplus}$(CH$_3$COO$^\ominus$)$_2$ anhydrous | 3 hours | 423 |

HMPT: hexamethylphosphoramide

EXAMPLES 21-30

An n-doped polyacetylene film highly doped with sodium, produced as described in Synthetic Metals, 1, (1980), 101–118, was immersed in a solution of a metal compound. The metals were deposited onto the n-(CH)$_x$ film, the metal compounds and solvents being varied.

Table 3 below shows the variations in the metals and solvents used and the amount (in percent by weight, based on the n-(CH)$_x$ film) of the individual metals deposited.

A fresh n-(CH)$_x$ film and a fresh metal compound solution was used for each experiment.

Unless indicated otherwise, the reaction time was one hour in each case, and the reaction temperature was 25° C.

TABLE 3

| Example No. | Metal compound | Solvent | | Amount deposited, in % by weight |
|---|---|---|---|---|
| 21 | [Pt(CH$_3$CN)$_2$$^{2\oplus}$(Cl$^\ominus$)$_2$ | CH$_3$CN | | 410 |
| 22 | [Pd(C$_6$H$_5$CN)]$_2$$^{2\oplus}$(Cl$^\ominus$)$_2$ | CH$_3$CN | | 370 |
| 23 | [Cu(HMPT)$_4$]$^\oplus$Br$^\ominus$ | HMPT | 3 hours | 402 |
| 24 | [Ag(NH$_3$)$_2$]$^\oplus$Cl$^\ominus$ | DMSO | | 315 |
| 25 | HgCN$_2$ | CH$_3$CN | | 450 |
| 26 | [Cu(Pyridine)$_4$]$^{2\oplus}$(Br$^\ominus$)$_2$ | | | |
| 27 | [Au(CH$_3$CN)$_2$]$^\oplus$Br$^\ominus$ | CH$_3$CN | | 520 |
| 28 | [Pd(TBP)$_4$]$^{2\oplus}$(Cl$_2$$^\ominus$)$_2$ | TBP$^a$ | | 320 |
| 29 | Pt[N(CH$_3$)$_3$]$_2$Cl$_2$ | DMF | | 415 |
| 30 | Pd[N(CH$_3$)$_3$]$_2$Cl$_2$ | NMP | | 325 |

$^a$TBP = tributyl phosphate

EXAMPLES 31 AND 32

A highly n-doped poly(p-phenylene) powder doped with sodium, produced as described in J. Chem. Phys., 73, 8 (1980), 4098–4102, was brought into contact with a metal compound dissolved in a solvent. The metals were deposited onto the poly(p-phenylene), the metal compounds and solvents being varied.

A fresh batch of poly(p-phenylene) sodium and a fresh metal compound solution were used for each experiment.

TABLE 4

| Example No. | Metal compound | Solvent | | Amount deposited in % by weight |
|---|---|---|---|---|
| 31 | Pd(CH$_3$CN)$_2$Cl$_2$ | NMP | 4 hours | 280 |
| 32 | Pt(CH$_3$CN)$_2$Cl$_2$ | DMF | | 310 |

EXAMPLES 33–35

The procedure followed was as described in Examples 21–30, and in addition an auxiliary reducing agent was added. The metals were deposited onto the n-(CH)$_x$ films, the metal compounds and solvents being varied.

| Example No. | Metal compound | Solvent | Auxiliary reducing agent | Amount of metal deposited in % by weight |
|---|---|---|---|---|
| 33 | [Ag(NHC$_4$H$_9$)$_2$]Cl | NMP | N$_2$H$_4$ | 350 |
| 34 | NiCl$_2$ anhydrous | DMSO | H$_3$PO$_2$ anhydrous | 310 |
| 35 | Pd(CH$_3$CN)$_2$Cl$_2$ | propylene dicarbonate | SnCl$_2$ anhydrous | 470 |

Reaction time: 1 hour, T = 25° C.

EXAMPLE 36

An n-doped (CH)$_x$ film having the composition Na$_{0.023}$(CH)$_x$ was treated with a suspension of Fe(CO)$_5$ in toluene at 100° C. The iron-coated film was extracted with toluene and dried under greatly reduced pressure. Weight increase due to iron: 186% by weight, based on [Na$_{0.023}$(CH)]$_x$.

We claim:

1. A process for depositing a metal having a standard potential E$_o$ of $> -2$V onto an electrically conductive polymeric carrier having the formula:

$$[M''_y (P)]_x \qquad \text{II}$$

where M'' is Li, Na, K, Rb or Cs, where P is $\text{-(CH-)}$, $\text{-(C}_6\text{H}_4\text{-)}$, $\text{-(C}_4\text{-)H}_2\text{S-)}$, $\text{-(C}_6\text{-)H}_4\text{S-)}$, $\text{-(C}_4\text{H}_2\text{O-)}$, $\text{-(C}_4\text{H}_2\text{NH-)}$, $\text{-(C}_6\text{H}_4\text{O-)}$, or $\text{-(C}_5\text{H}_3\text{N-)}$, y is a numeral from 0.001 to 0.6 and x is a numeral from 5 to 1000; or the formula:

$$[(P) (X)_y]_x \qquad \text{III}$$

where P is as identified in the above formula II, X is ClO$_4$, AsF$_6$, PF$_6$, SbF$_6$, BF$_4$, HSO$_4$, CF$_3$SO$_3$, or Br, y is a numeral from 0.001 to 0.6 and x is a numeral from 5 to 1000; from a solution of a metal cation compound by reduction of the metal cation dissolved in an aprotic polar or nonpolar solvent, said metal cation being selected from the group consisting of Au$^+$, Au$^{+++}$, Pt$^{++}$, Pd$^{++}$, Ag$^+$, Hg$^{++}$, Hg$_2^{++}$, Cu$^+$, Cu$^{++}$, Re$^{+++}$, Bi$^{+++}$, Fe$^{+++}$, Pb$^{++}$, Ni$^{++}$, Co$^{++}$, Fe$^{++}$, Zn$^{++}$, and Mn$^{++}$, the anion of the metal cation compound being selected from the group consisting of F$^-$, Cl$^-$, Br$^-$, I$^-$, CN$^-$, NO$_3^-$, CH$_3$COO$^-$, CH$_3$SO$_3^-$, H$_3$PO$_2^-$ and ClO$_4^-$, said metal cation compound optionally containing a substituent selected from the group consisting of RCN where R is an alkyl, cycloalkyl or aryl of from 1–6 carbon atoms, OPR$^1$R$^2$R$^3$ where R$^1$, R$^2$ and R$^3$ are the same or different with each being selected from the group consisting of an alkyl, cycloalkyl, aryl, alkoxy, cycloalkoxy or aryloxy of from 1–6 carbon atoms, pyridyl, hexamethylphosphoramide, NH$_3$ and CO, and where P is defined as in the formula II.

2. A process as set forth in claim 1, wherein the deposition of the metal M onto an electrically conductive, polymeric carrier of the general formula (II), where y is from 0.1 to 0.6 and x is from 5 to 1,000, is carried out chemically, or a metal compound of the general formula (I) which can be decomposed thermally to the metal is used.

3. The process of claim 1 wherein the deposition of the metal onto an electrically conductive, polymeric carrier of the general formula (II) or (III), where y is from 0.001 to 0.1 and x is from 5 to 1,000, is carried out electrochemically, and the carrier is made the cathode in an electrolytic cell or is applied to a cathode.

4. The process of claim 1, wherein the aprotic polar solvent is acetonitrile, sulfolane, propanediol 1,2-carbonate, acetone, acetylacetone, ethyl acetate, diethyl ether, trimethyl phosphate, tributyl phosphate, dimethylformamide, N, N-dimethylacetamide, N-methylpyrrolidone, dimethylsulfoxide or hexamethylphosphoramide, and the aprotic non-polar solvent is n-hexane, n-heptane, n-octane, ligroin, benzene, toluene or xylene.

5. The process of claim 1 wherein the deposition of the metal onto the electrically conductive, polymeric carrier of the general formula (II) is carried out at from $-100°$ to $+100°$ C.

* * * * *